(12) United States Patent
Gresser et al.

(10) Patent No.: US 8,426,850 B2
(45) Date of Patent: Apr. 23, 2013

(54) SEMICONDUCTING COMPONENT INCLUDING 1-[3-ARYL-ISOINDOLYL-(1)-IMINO]-3-ARYL-IH-ISOINDOLE

(75) Inventors: Roland Gresser, Dresden (DE); Toni Mueller, Dresden (DE); Markus Hummert, Dresden (DE); Moritz Riede, Dresden (DE); Horst Hartmann, Dresden (DE); Karl Leo, Dresden (DE)

(73) Assignee: heliatek GmbH, Dresden (DE)

( * ) Notice: Subject to any disclaimer, the term of this patent is extended or adjusted under 35 U.S.C. 154(b) by 0 days.

(21) Appl. No.: 13/321,304

(22) PCT Filed: May 19, 2010

(86) PCT No.: PCT/DE2010/000552
§ 371 (c)(1),
(2), (4) Date: Jan. 31, 2012

(87) PCT Pub. No.: WO2010/133208
PCT Pub. Date: Nov. 25, 2010

(65) Prior Publication Data
US 2012/0126213 A1    May 24, 2012

(30) Foreign Application Priority Data

May 19, 2009  (DE) .......................... 10 2009 021 881
May 19, 2009  (DE) .......................... 10 2009 021 882

(51) Int. Cl.
*H01L 51/30*    (2006.01)

(52) U.S. Cl.
USPC .............................. 257/40; 548/402; 544/349

(58) Field of Classification Search .................... 257/40, 257/E25.009; 544/235, 349; 548/402, 405, 548/452, 469
See application file for complete search history.

(56) References Cited

U.S. PATENT DOCUMENTS

2009/0134784 A1 *  5/2009  Lin et al. ...................... 313/504

OTHER PUBLICATIONS

Van Slyke et al., "Organic electroluminescent devices with improved stability", 69 Appl. Phys. Lett. 2160, Oct. 7, 1996.*
Bredereck et al., 1972, "Synthesen in der heterocyclischen Reihe, XV. Über 1-[3-Aryl-isoindolyl-(1)-imino]-3-aryl-1H-isoindole," Chemische Berichte, 105(7):2271-2283.
Donyagina et al., 2008, "Synthesis of N,N-difluoroboryl complexes of 3,3'-diarylazadiisoindolylmethenes," Tetrahedron Letters, 49(42):6152-6154.
Drechsel et al., 2004, "High Efficiency Organic Solar Cells Based on Single or Multiple Pin Structures," Thin Solid Forms, 451-452, 515-517.
Drechsel et al., 2004, "MIP-type Organic Solar Cells Incorporating Phthalocyanine/Fullerene Mixed Layers and Doped Wide-Gap Transport Layers," Organic Electronics 5:175-186.
Kloetzing et al., 2007, "The Mg-Oppenauer Oxidation as a Mild Method for the Synthesis of Aryl and Metallocenyl Ketones," Chem. Eur. J., 13:215-227.

(Continued)

*Primary Examiner* — Thomas L Dickey
(74) *Attorney, Agent, or Firm* — Sutherland Asbill & Brennan LLP (57) ABSTRACT

The present invention relates to an organic semiconductor element that comprises multiple layers. One or more layers may include compounds that can function as light absorbers, charge transporting materials, and/or as a dopant.

12 Claims, 7 Drawing Sheets

OTHER PUBLICATIONS

Kobayashi et al., 2006, "New Synthesis of Isoquinoline and 3,4-Dihydroisoquinoline Derivatives," Bull. Chem. Soc. Jpn., 79:1126-1132.

Krasovskiy et al., 2004, "A LiCl-Mediated Br/Mg Exchange Reaction for the Preapration of Functionalized Aryl- and Heteroarylmagnesium Compounds from Organic Bromides" Angew. Chem. Int. Ed., 43:3333-3336.

Maenning et al., 2004, "Organic p-i-n Solar Cells," Appl. Phys. A 79, 1-14.

Peumans et al., 2003, "Small Molecular Weight Organic Thin-Film Photodetectors and Solar Cells," Journal of Applied Physics, 93(7):3693-3723.

Rogers et al., 1943, "156.2,4-Diarylpyrroles. Part I. Synthesis of 2 : 4-diarylpyrroles and 2 : 2', 4 : 4'-tetra-arylazadipyrromethines," J. Chem. Soc., 590-596.

PCT International Search Report for PCT/DE2010/000552 mailed Sep. 24, 2010.

* cited by examiner

Example 1    Example 2    Example 3    Example 4

SEMICONDUCTING COMPONENT INCLUDING 1-[3-ARYL-ISOINDOLYL-(1)-IMINO]-3-ARYL-IH-ISOINDOLE

CROSS-REFERENCE TO RELATED APPLICATIONS

This is a submission pursuant to 35 U.S.C. 154(d)(4) to enter the national stage under 35 U.S.C. 371 for PCT/DE2010/000552, filed 19 May 2010. Priority is claimed under 35 U.S.C. 119(a) and 35 U.S.C. 365(b) to German Patent Application Numbers 10 2009 021 881.5, filed May 19, 2009, and 10 2009 021 882.3, filed 19 May 2009. The disclosures of PCT/DE2010/000552, DE 10 2009 021 881.5, and DE 10 2009 021 882.3 are expressly incorporated herein by reference.

FIELD OF THE INVENTION

The present invention relates to a semiconductor element comprising multiple layers. One or more layers may also include compounds that may function as light absorbers, charge transporting material and/or a dopant.

BACKGROUND OF THE INVENTION

In recent years, organic compounds with high absorption capabilities in the red and infrared spectral range have generated considerable interest because of their suitability for use in many fields of science and technology. For example, compounds of such kind can be used as active media in laser-driven recordable media such as CD or DVDs, or in solar cells to convert thermal radiation into electrical energy and in thermal insulation materials to prevent the interiors of closed spaces from overheating, in motor vehicles or display window areas for example. At the same time, compounds of such kind that absorb long-wave energy must also have the properties of absorbing practically no energy in the shorter-wave, visible spectral band as far as possible, and being thermally stable, so that they can be rendered usable for their respective purpose by vacuum evaporation processes, for example.

Many compound types that are capable of absorbing large quantities of light in the red and infrared spectral band besides being endowed with various other features defining their respective purposes have already been discovered in the past. In most cases, however, the spectrum of desired features is not available from one compound type alone. For example, polymethine dyes, most of which contain a polymethine chain of sufficient length to absorb a useful quantity of light in the red and infrared spectral band, have very low thermal stability which, due to their predominantly ionic nature, hinders non-decomposing evaporation. A similar situation applies for the products of oxidation of aromatic or heteroaromatic di- and polyamines, of the 4,4',4'',4'''-tetrakis-(diarylamino)-N,N-tetraphenyl-benzidine type for example, and their aryl homologues, which absorb very long wave light in their oxidised state, but also vaporise poorly due to their ionic nature, and are thus unsuitable for many applications. In contrast to such compounds, nickel dithiolene complexes are also capable of absorbing very long-wave light in the infrared spectral band, and most are sufficiently thermally stable to evaporate readily, but their capacity to absorb light in the long-wave spectral band is often extremely low, so that in order to achieve absorption profiles in the IR spectral region with these compounds high concentrations or layer thicknesses must be used, which then frequently result in interference absorptions in the visible spectral band.

The only materials currently known for organic solar cells demonstrating absorption above 70 mm are compounds from the phthalocyanine series. These compounds are known for their high long-wave absorption and good stability, but because they are poorly soluble it is very difficult if not impossible to optimise them in terms of other properties such as the energy disposition of their surface orbitals.

The object of the present invention is therefore to provide semiconductor components that contain organic compounds with high absorption properties in the red and infrared spectral band, but which overcome the drawbacks of the related art and in particular are capable of non-decomposing evaporation for the purpose of manufacturing the component, that is to say they demonstrate good thermal stability and are able to absorb light in the long waveband.

BRIEF SUMMARY

This object is solved with a semiconductor component comprising multiple layers, wherein at least one of the layers includes at least one compound having general formula A, B or C:

in which M is a metal ion preferably having a charge of such magnitude that electroneutral complexes of type B or C are created; R is selected independently in each case from the group of unsubstituted or substituted $C_1$-$C_{20}$ alkyl, $C_1$-$C_{20}$ heteroalkyl, $C_6$-$C_{20}$ aryl, $C_6$-$C_{20}$ heteroaryl, saturated or unsaturated carbo- or heterocyclic compounds; $L^1$ and $L^2$ may be the same or different and represent atomic or molecular assemblies that completely fill the valence shell of M; and —$X_1$— represents a molecular fragment that together with the adjacent C—C double bond of the pyrrole ring forms an aromatic or heteroaromatic structure element.

DETAILED DESCRIPTION

In this context, it is particularly preferred if the component is selected from an organic solar cell, a photodetector or an organic field effect transistor. The claims of the invention are not intended to extend to light emitting diodes, but rather organic-inorganic hybrid semiconductors in general.

It is preferably suggested that metal ion M is selected from the ions of the elements in groups 9 to 13 of the Periodic Table, preferably Cu, Zn, Ni, B or Al.

One advantageous embodiment is characterized in that each Xi is selected independently from

$X_1$

$X_2$

$X_3$

$X_4$

$X_5$ $X_6$ $X_7$ $X_8$ $X_9$ $X_{10}$ $X_{11}$ in which $R^1$-$R^7$ are selected independently from the group consisting of hydrogen, halogen, unsubstituted or substituted $C_1$-$C_{20}$ alkyl, $C_1$-$C_{20}$ heteroalkyl, $C_6$-$C_{20}$ aryl, $C_6$-$C_{20}$ heteroaryl, saturated or unsaturated carbo- or heterocyclic compounds, or wherein two adjacent moieties $R^1$-$R^6$ belong to another carbocyclic or heterocyclic ring; and where Q stands for a divalent atomic assembly that contains the elements C, N, O or S.

For example, Q may be —$CH_2$—, —NH—, —O— or —S—.

It is further preferred if L1 and L2 are chosen independently from the group consisting of halogen, alkyl, aryl, alkyloxy, aryloxy, acyl, aroyl, alkenyl or alkinyl, or L1 and/or L2 may each be bound to an R.

If L1 and/or L2 are bound to moieties R, this enables formation of a further ring via the M-L-R connection. This may be effected for example in the form of M-O-R of an ether bridge or M-S-R of a thioether bridge.

It is further preferably provided that the layer containing at least one compound of formula A, B or C is a light absorber layer or a charge carrier transport layer.

It is further preferred if the components is photoactive.

One embodiment is characterized in that the plurality of layers is arranged in a pin structure.

Finally, it is also preferred if the semiconductor component is an organic semiconductor component.

The invention also relates to the use in a semiconductor component of a compound having general formula A, B or C

A

B

C in which M is a metal ion preferably having a charge of such magnitude that electroneutral complexes of type B or C are created; R is selected independently in each case from the group of unsubstituted or substituted $C_1$-$C_{20}$ alkyl, $C_1$-$C_{20}$ heteroalkyl, $C_6$-$C_{20}$ aryl, $C_6$-$C_{20}$ heteroaryl, saturated or unsaturated carbo- or heterocyclic compounds; $L^1$ and $L^2$ may be the same or different and represent atomic or molecular assemblies that completely fill the valence shell of M; and —$X_1$— represents a molecular fragment that together with the adjacent C—C double bond of the pyrrole ring forms an aromatic or heteroaromatic structure element.

Moieties R1-R7 and R may preferably be selected from the group consisting of alkyl, alkoxy, dialkylamine, alkyl sulphanyl, alkyl sulphenyl, alkyl sulphonyl, phenyl, napthyl, anthryl, fluorenyl, aryloxy, aryl sulphanyl, aryl sulphenyl, aryl sulphonyl, phenyl, kylamine, diarylamine, pyrrolidine, tetrahydrofuran, tetrahydrothiophene, piperidine, tetrahydropyran, tetrahydrothiopyran, pyrrole, furan, thiophene, pyridine, pyrylium ion, thiopyrylium ion, quinoline, purine, oxazol, thiazol, benzothiazol, pyrazine, imidazol, pteridine, acridine, pyrimidine and indol. It is also conceivable that adjacent moietys may form part of another carbocyclic or heterocyclic ring.

The compounds of formula types A-C may be produced in various ways, for example preferably from the known compounds having general formula types 2, 4 or 8 (see below), in which the letters X and R have the same meaning as above, by heating them with the ammonium salt of a preferably organic acid, such as formic or acetic acid, in a dipolar solvent (Solv) with high boiling point, such as a primary or secondary alkanol having a boiling point above 150° C., an aliphatic carboxylic acid amide, such as formamide, DMF or dimethyl acetamide, or also in a polyvalent alkanol of the 1,2-, 1,3-diol or 1,2,3-triol type, leading to the formation, in a mostly gradual reaction, as described for exemplary purposes by V. F. Donyagina, S. Shimizu, N. Kobayashi and E. A. Lukyanets in Tetrahedron Lett. 2008, 49, 6152, initially of the compounds having general formula type A, recognizable by their deep colours, which are then, following their isolation, reacted as necessary by heating with a compound having general formula ML1L2L3, in which L1 and L2 have the same meaning as above and L3 is a ligand identical to or different from L1 and L2, and like L1 and L2 is able to form a stable coordination sphere with atom M, in a polar solvent, such as a low or higher alkanol, an aliphatic carboxylic acid amide, such as formamide, DMF or dimethyl acetamide, a carboxylic acid anhydride such as acetic acid anhydride or propionic acid anhydride, methylene chloride or 1,2-dichloroethane, to form the target compounds of formula type B or C.

-continued

Regarding the compounds having formula type 2, 4 or 8 referred to above, the compounds of type 2 may be obtained by reacting compounds of formula type 1, as described by H. Bredereck and H. W. Vollmann in Chem. Ber. 1972, 105, 2271, with a metallorganic compound having general formula type R-MZn, in which moiety R has the same meaning as in formula A, n is either 0 or 1, and M stands for a metal ion preferably from group 1 or 2 of the Periodic Table, wherein in the latter case n=1 and this metal ion may thus still be bonded with a suitable moiety Z which saturates the valence of M, preferably such as a halogen atom, the compounds of formula type 4 may be obtained by reacting compounds of formula type 3, as described by M. A. T. Rogers in J. Chem. Soc. 1943, 590, with a nitrosating reagent NO—Y, for example with sodium nitrite in mineral acid solution or with nitrous acid alkyl esters in alcohol/mineral acid solution, and the compounds of formula type 8 are obtained either by first bringing compounds of formula type 5 with isopropyl magnesium chloride, as described for example by A. Krasovskiy and P. Knochel in Angew, Chem. Int. Ed. 2004, 43, 3333, into a conversion reaction with compounds of formula type 6 and then converting these, as described for example by R. J. Kloetzing, A. Krasovsky, and P. Knochel in Chem. Eur. J. 2007, 215, by reacting them with a compound of general formula type 7 or compounds of general formula type 9 with metal cyanides, such as are described for example by K. Kobayashi et al. in Bull. Chem. Soc. Japan 2006, 79, 1126.

Surprisingly, it was found that the semiconductor components according to the invention do not have the drawbacks associated with the prior art, and are active in an excellent spectral range and demonstrate high thermal stability particularly due to the use of compounds of types A-C.

Compounds A, B and C have semiconductive properties that were previously unknown in the prior art. This means that a layer that is made exclusively from material compounds A, B and/or C with no additives or other chemical alterations already possesses semiconductor properties. In the components according to the invention, compounds A, B and/or C are used as semiconductor layers and not as dopants. In this context, doping is understood to mean that a small number of individual molecules (dopant) are incorporated into a layer (matrix) in order to gain or lose a charge and thus change the semiconductor properties of the layer (matrix).

According to the invention, the semiconductor component is constructed from various material layers that perform different functions by applying the materials one after the other to each preceding layer through vapour deposition. In this context, a closed layer means that the previous layer is completely covered. The consequence of this is that the charge carriers must be transported in this layer (or through this layer). It follows that these layers must have semiconductor capabilities and enable charge carriers to move very freely. A dopant does not have to possess both properties.

The combination of the absorption properties and electrical properties of compounds A, B and C result in surprising manner in an organic, preferably photoactive component that was not known from the prior art and exhibits extremely satisfactory overall properties, such as excellent activity in the desired spectral range and good thermal stability.

Preferred according to the invention are semiconductor components in which the layers that comprise at least one compound having general formula A, B or C are dosed layers or layers with interpenetrating networks. As was explained in the preceding, a dosed layer means that the previous layer is completely covered by the layer in question. A layer with interpenetrating network is the term used to describe a layer in which components of the layer pass through each other reciprocally. This may be achieved for example vapour deposition of two materials at the same time, which then arrange themselves in a mixed layer. In such cases, an interpenetrating network included closed percolation paths (migration paths for charge carriers), which are created in a mixed layer when the material of which a smaller quantity is present is present is contained in a mixture ratio of at least >20 percent by weight This differs from the ratio for doping a matrix material, in which the dopant is present in a quantity of only about four percent by weight, so that units or dusters of the dopant isolated there are formed in the matrix layer. Interpenetrating networks with closed percolation paths enable the good charge carrier mobilities to be exploited. For this reason, it is particularly preferred to provide components according to the invention in which at least one compound having general formula A, B or C is present in a closed layer or closed percolation paths within a mixed layer.

The compounds of formula types A-C are usually thermally stable up to temperatures in most cases well above 300° C., and therefore vaporise without decomposition in a high vacuum below this temperature, enabling them to be used in a component in various ways, preferably as light absorbers in organic solar cells for example due to their ability to absorb long-wave light in the red or near infrared spectral band, or as charge generation or charge transport material in organic solar cells and organic field effect transistors on account of their high redox stability. To this end, the compounds described are applied to a suitable substrate with a structure of which an example is described in the following by vaporising them from a container in a vacuum chamber at pressures of about 10-7 Torr in such manner that no decomposition of the substance occurs and a vapour deposited layer having a defined thickness forms, which may be arranged if necessary in conjunction with other layers, each of which has a specific electronic function.

One particular advantage of compounds A-C as photoactive layers in organic solar cells consists in that they exhibit increased spectral sensitivity in the long-wave spectral range due to the long-wave absorption of the light absorber used. Thus, the portion of light energy that is converted into electrical energy can be extended to a range above 600 nm, but preferably over 700 nm and particularly preferably over 800 nm.

The open circuit voltage serves as an important parameter in photovoltaic semiconductors such as components, and this may reach high values when the compounds described above are used. It arises from the relative positions of the energy levels of the donor and receiver materials, the energy levels of which may be varied if necessary by suitable electron-attracting or electron-repelling groups in such manner that the energy loss during electron transfer is reduced and the open circuit voltage is increased. Besides the advantages described previously of using the compounds described above in solar cells, semiconductors of such kind have a particularly high fill factor, which in the specific case of compound B1 (see below) is equivalent to 64.89%. The fill factor is given by the quotient of the maximum power and the product of open circuit voltage and short circuit current and thus describes the "squareness" of the current-voltage characteristic as a measure of the quality of a solar cell.

Of particular advantage for purposes of increasing the efficiency of semiconductors such as components is the "pin structure". In this structure, the intrinsic, active layers are placed between two doped layers of organic semiconductors, which preferably have a large bandgap and are therefore transparent. The p-doped layer follows the donor material and has a HOMO energy that is adjusted to the HOMO energy of the donor. The n-doped layer follows the acceptor material and has a LUMO energy that is adjusted to the LUMO energy of the acceptor material. Because of their doping, these layers have very good conductivity and result in several improvements. The adjustment to the energies causes the n-doped layers to transport mainly excited electrons and p-doped layers to transport mainly excited holes. For this reason, they are also known as electron or hole transport layers respectively (ETL or HTL). In a pin structure, this helps to reinforce the separation of charge carriers, which is particularly important in photoactive semiconductors such as solar cells, for example. The high conductivity of the layers causes a reduction in the injection barrier for charge carriers at the contact, which would otherwise represent a loss mechanism. If transparent materials are used as the ETL and/or HTL, these layers may be used to shift the active, absorbing layers to the site of the optical maximum of the incident light in order to increase the quantity of light absorbed in the active layer, and therewith the efficiency of the semiconductor (component). (Maennig et al., Appl. Phys. A79, 1-14 (2004)).

Independently of the absorption properties of compounds A-C, the good charge carrier transport properties these compounds exhibit has revealed a further field of application for the use of field effect transistors. In these components, the compounds A-C described in the preceding are disposed between two electrodes, one of which is designated the emitter (source) and the other being the collector (drain). In this context, the organic semiconductor material may still be doped with other suitable compounds to increase the number of electrical charge carriers. These may be both n and p-dopants. A third base electrode (gate) is separated from the organic semiconductor material by an insulating material This third electrode may be located on top of the semiconductor material (top-gate arrangement) or underneath it (bottom-gate arrangement). When a control voltage is applied between the source and gate electrodes, the current flow between the two electrodes may be deliberately controlled. This is achieved because the charge carriers created by the doping are enriched close to the insulating layer in the organic semiconductor material when the electrical field is applied. This causes a reduction in the inherent resistance of the organic semiconductor layer in this area, thereby enabling current to flow between the source and drain electrodes.

Further advantages and features of the semiconductor component according to the invention are presented in the following detailed description of preferred embodiments with reference to the accompanying drawing, in which

Now, a few examples of synthesis for, reducing the compounds of types A-C will be described.

EXAMPLES

1. Production of Diisoindolyl Azomethines Having General Structure A 1.a Synthesis of (3-Phenyl-2H-isoindol-1-yl)-(3-phenyl-isoindol-1-ylidene) amine (A1)

A1

A phenylmagnesium bromide solution prepared from bromobenzene (15.7 g, 0.1 Mol) and magnesium chips (2.7 g, 0.11 Mol) according to known instructions is added dropwise with stirring to a suspension of pthalodinitrile (12.8 g, 0.1 Mol) in toluene (100 mL) at room temperature and the resulting mixture is then stirred for 2 hours or overnight.

Chlorotrimethyl silane (10.8 g, 0.1 Mol) is added to the reaction mixture obtained, and the precipitate is removed by suction and washed with diethylether. The solid substance obtained is then heated in for about 10 minutes in formamide (500 mL), until a deep, dark blue colour appears and a copper-coloured precipitate is formed. The mixture is allowed to cool and the precipitate is removed by suction and then washed with water and methanol.

The compound is almost analytically pure and may be purified further by column chromatography on silica gel by elution with chloroform.

Yields: 12 g (30 mmol, 30%), red-purple needles.
Melting point 260.7° C.
1H-NMR (500 MHz, CDCl3): 7.32 (t, 211, J=7.9 Hz) 7.41 (t, 2H, J=7.7 Hz), 7.47 (t, 2H, 1=7.37 Hz), 7.57 (t, 411, J=7.47 Hz), 7.96 (d, 211, J=8.0 Hz), 8.03 (d, 4H, 1=7.12 Hz), 8.13 (d, 2H, J=7.89 Hz).
13C-NMR (125 MHz, CDCl3): 121.31, 122.14, 126.33, 127.57, 127.74, 129.22, 129.42, 129.92, 133.18, 13538, 143.86, 148.58.
MS (ESI): Calculated [M+1]: 398.47. Actual: 398.2.
Calculated for C28H19N3: C, 84.61; H, 4.82; N, 10.47. Actual: C, 82.6; H, 5.1; N, 9.9.

Figure 1:
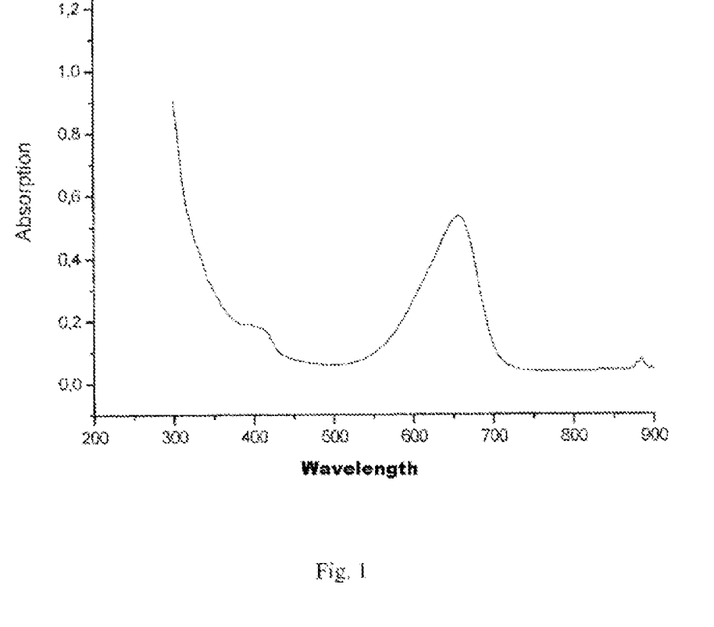
FIG. 1 shows an absorption spectrum of compound A1 in dichloromethane.
Figure 2:
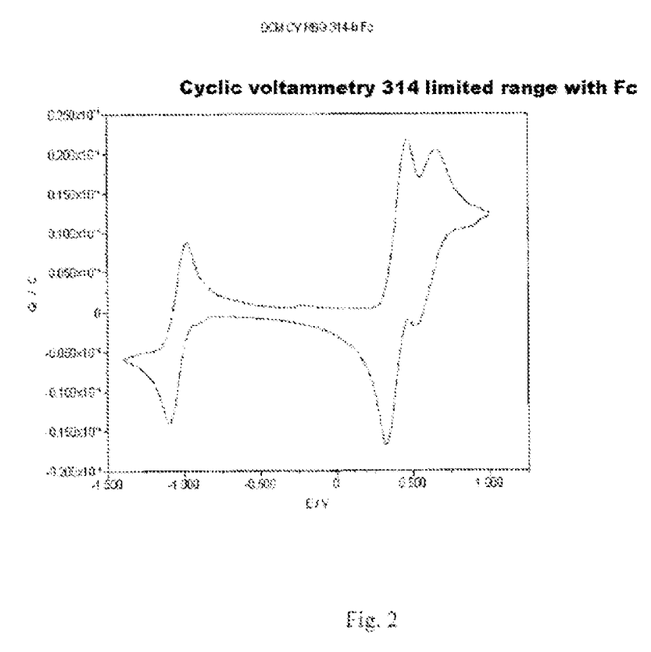
FIG. 2 shows a cyclovoltammogram of compound A1 in dichloromethane with ferrocene as the internal standard and tetrabutyl ammonium hexafluorophosphate (1 mMol) as the conducting salt with a scan speed of 100 mV/s at 25° C.

The absorption spectrum of compound A1 in dichloromethane and the cyclovoltammogram of compound A1 in dichloromethane with ferrocene as the internal standard and tetrabutyl ammonium hexafluorophosphate (1 mMol) as the conducting salt with a scan speed of 100 mV/s at 25° C. are shown in FIGS. 1 and 2 respectively.

1b. Synthesis of [3-(4-Methoxyphenyl)-2H-isoindol-1-yl]-[3-(4-methoxyphenyl)-isoindol-1-ylidene] amine (A2)

A2

A para-Methoxyphenyl-magnesium bromide solution prepared from p-bromobenzene (18.7 g, 0.1 Mol) and magnesium chips (27 g, 0.1 Mol) is added dropwise with stirring to a suspension of pthalodinitrile (12.8 g, 0.1 Mol) in toluene (100 mL) at mom temperature and the resulting mixture is then stirred for 2 hours or overnight.

Chlorotrimethyl silane (10.8 g, 0.1 Mol) is added to the reaction mixture obtained, and the precipitate that forms is washed with diethylether after its removal by suction. The solid substance thus obtained is then heated in for about 10 minutes in formamide (500 mL), until a deep, dark blue colour appears and a copper-coloured precipitate separates therefrom. After the solution has cooled, the precipitate is removed by suction and washed with water and methanol. The product is practically analytically pure and if necessary may be purified further by column chromatography on silica gel by elution with chloroform.

Yield: 9.5 g (19 mmol, 19%), red-purple needles.
Melting point 154° C.
1H-NMR (500 MHz, CDCl3): 3.91 (s, 6H), 7.08 (d, 2H, J=3.85 Hz), 72 (t, 2H, 1=7.01 Hz), 7.37 (t, 211, J=7.03 Hz), 7.91 (d, 2H, J=8.08 Hz), 7.97 (d, 4H, J=8.83 Hz), 8.10 (d, 2H, 7.91 Hz).
13C-NMR (125 MHz, CDCl3): 55.50, 114.73, 121.19, 122.07, 125.4, 126.04, 127.42, 129.21, 129.66, 135.30, 143.42, 147.64, 160.68.
MS (ESI): Calculated [M+1]: 458.5. Actual: 458.2.
Calculated for C30H23N3O2: C, 78.75; H, 5.07; N, 9.18. Actual: C, 78.43; H, 4.99; N, 8.02.

Figure 3:
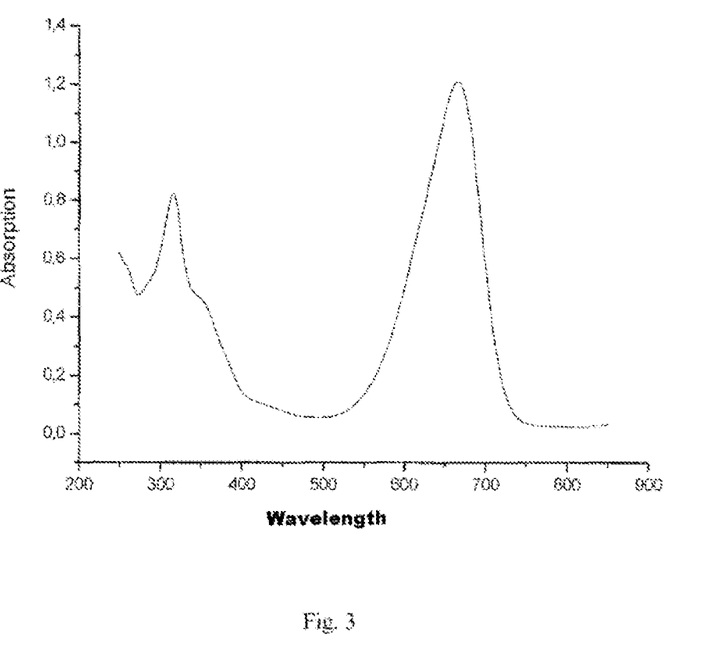
FIG. 3 shows an absorption spectrum of compound A2 in dichloromethane.
Figure 4:
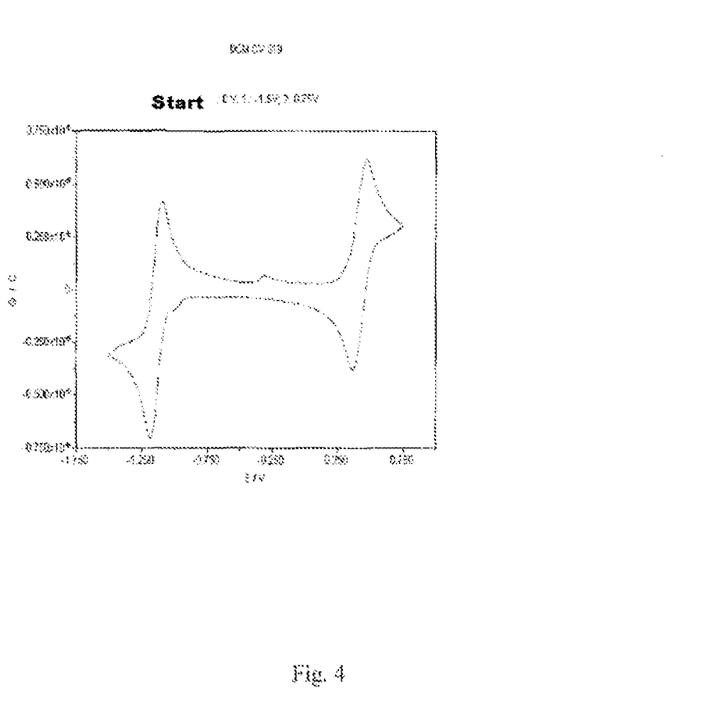
FIG. 4 shows a cyclovoltammogram of compound A2 in dichloromethane with ferrocene as the internal standard and tetrabutyl ammonium hexafluorophosphate (1 mMol) as the conducting salt with a scan speed of 100 mV/s at 25° C.

The absorption spectrum of compound A2 in dichloromethane and the cyclovoltammogram of compound A2 in dichloromethane with ferrocene as the internal standard and tetrabutyl ammonium hexafluorophosphate (1 mMol) as the conducting salt with a scan speed of 100 mV/s at 25° C. are shown in FIGS. 3 and 4 respectively.

2. Preparation of Diisoindolyl Azomethine Complexes Having General Structure B

2a. Synthesis of 11,11-Difluoro-10,12-diphenyl-11H-5,10a-diiaza-11a-azonium-11-boranato-indeno [2,1-b]fluorene (B1)

B1

First diisopropyl ethylamine (6.45 g, 50 mmol) and then boratrifluoride diethyl etherate (7.05 g, 50 mmol) are added dropwise to a solution of compound A1 (3.97 g, 10 mmol) in dichloroethane (80 mL) at room temperature. The solution thus obtained is warmed and then heated for about 10 minutes with reflux until the initially blue solution has turned green and none of the starting product is detectable by thin film chromatography. The solution is allowed to cool and water (100 mL) is added. The organic phase is washed with water three times (50 ml on each occasion) and the solvent is drawn off in a vacuum. The remaining residue is dissolved in chloroform for cleaning and filtered over silica gel (chloroform).

Yield: 3.9 g (8.8 mmol, 88%), red-purple needles.
Melting point 273° C.
1H-NMR (500 MHz, CDCl3): 7.30 (t, 2H, J=6.98 Hz), 7.51 (m, 8H), 7.62 (d, 211, J=8.15 Hz), 7.87 (d, 4H, 7.86 Hz), 8.11 (d, 2H, 8.00 Hz).
13C-NMR (125 MHz, CDCl3): 121.19, 124.15, 127.03, 128.44, 130.16, 130.19, 130.31, 130.47, 131.14, 133.63, 139.34, 153.20.

19F-NMR (2282. MHz, CDCl3): −129.51 (q, 2F, 1=31.0 Hz)

MS (ESI): Calculated [M+1]: 446.1. Actual: 446.2.

Calculated for C28H18BF2N3: C, 75.53; H, 4.07; N, 9.44. Actual: C, 75.33; H, 3.94; N, 9.27.

Figure 5:
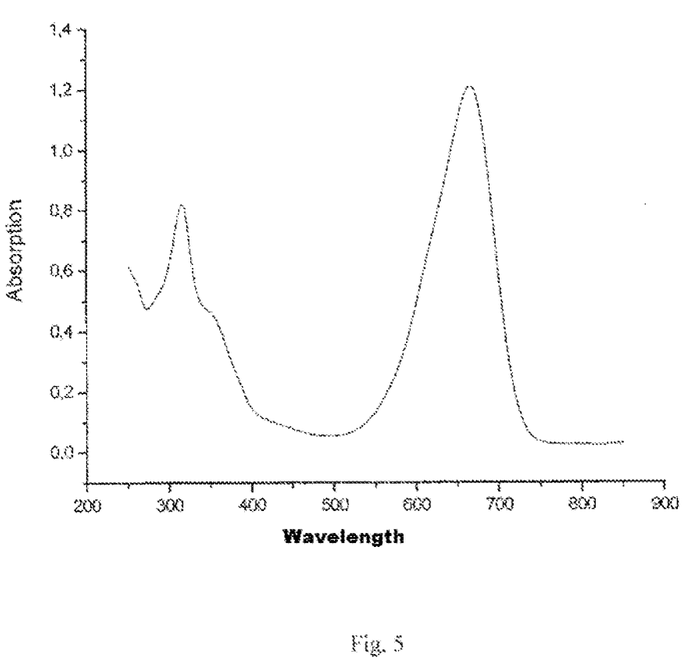
FIG. 5 shows an absorption spectrum of compound B1 in dichloromethane.
Figure 6:
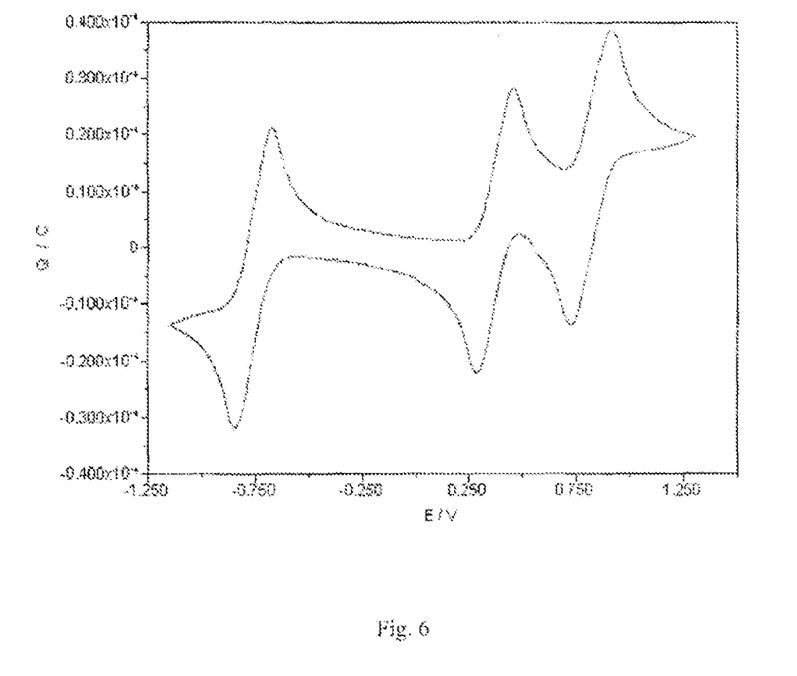
FIG. 6 shows a cyclovoltammogram of compound B1 in dichloromethane with ferrocene as the internal standard and tetrabutyl ammonium hexafluorophosphate (1 mMol) as the conducting salt with a scan speed of 100 mV/s at 25° C.

The absorption spectrum of compound B1 in dichloromethane and the cyclovoltammogram of compound B1 in dichloromethane with ferrocene as the internal standard and tetrabutyl ammonium hexafluorophosphate (1 mMol) as the conducting salt with a scan speed of 100 mV/s at 25° C. are shown in FIGS. 5 and 6 respectively.

2b. Synthesis of 11,11-Difluoro-10,12-bis(-p-methoxyphenyl)-11H-5,11a-diaza-10a-azonium-11-baranato-indeno[2,1-b]fluorene (B2)

B2

First diisopropyl ethylamine (6.45 g, 50 mmol) and then borotrifluoride diethyl etherate (7.05 g, 50 mmol) are added dropwise to a solution of compound A2 (5.05 g, 10 mMol) in dichloroethane (80 mL) at room temperature. The resulting solution is warmed and then heated for about 10 minutes with reflux until the initially blue solution has turned green and none of the starting product is detectable by thin film chromatography. The solution is allowed to cool and water (100 mL) is added. The organic phase is washed with water three times (50 ml on each occasion) and the solvent is drawn off in a vacuum. The residue is dissolved in chloroform for cleaning and filtered over silica gel.

Yield: 4.1 g (8.1 mMol, 81%), copper-coloured needles.

Melting point: 256° C.

1H-NMR (500 MHz, CDCl3): 3.88 (s, 6H), 7.03 (d, 4Hm, 7.29 (t, 2H, J=7.01 Hz), 7.48 (t, 2H, J=7.15), 7.65 (d, 2H, J=8.11 Hz), 7.89 (d, 4H, J=8.84 Hz), 8.09 (d, 2H, J=8.00 Hz).

13C-NMR (125 MHz, CDCl3): 55.36, 114.10, 121.14, 122.95, 124.14, 126.81, 130.11, 131.06, 132.04, 133.51, 139.09, 152.41, 161.32.

19F-NMR (228.2 MHz, CDCl3): −129.70 (q, 2F, J=31.0 Hz)

MS (ESI): Calculated [M+1]: 506.3. Actual: 506.2.

Calculated for C28H18BF2N3: C, 71.31; H, 4.39; N, 8.32. Actual: C, 71.14; H, 458; N, 8.22.

Figure 7:
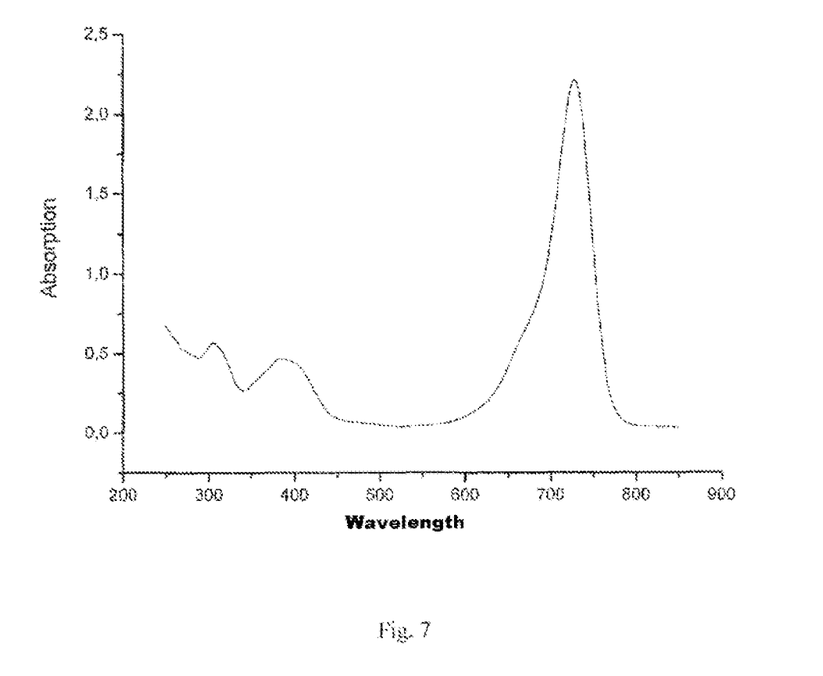
FIG. 7 shows an absorption spectrum of compound B2 in dichloromethane.
Figure 8:
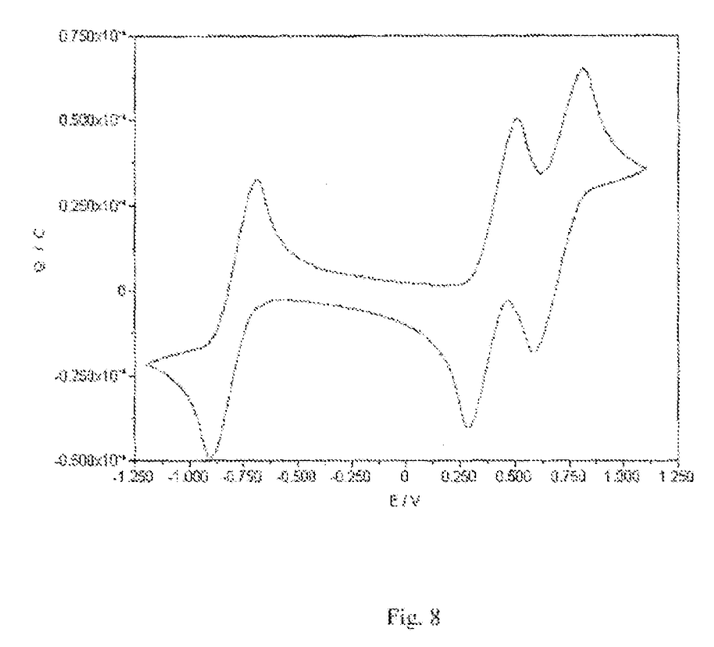
FIG. 8 shows a cyclovoltammogram of compound B2 in dichloromethane with ferrocene as the internal standard and tetrabutyl ammonium hexafluorophosphate (1 mMol) as the conducting salt with a scan speed of 100 mV/s at 25° C.

The absorption spectrum of compound B2 in dichloromethane and the cyclovoltammogram of compound B2 in dichloromethane with ferrocene as the internal standard and tetrabutyl ammonium hexafluorophosphate (1 mMol) as the conducting salt with a scan speed of 100 mV/s at 25° C. are shown in FIGS. 7 and 8 respectively.

3. Preparation of Diisoindolyl Azomethine Complexes Having General Structure C

3a. Synthesis of Bis-[3-(4-Methoxyphenyl)-2H-isoindol-1-yl]-[3-(4-methoxyphenyl)-isoindol-1-ylidene]amine zinc complex (C1)

C1

A solution of diisopropyl ethylamine (6.45 g, 50 mMol) and ZnCl2 (7.0 g, 50 mMol) is added to a solution of compound A1 (5.05 g, 10 mMol) in dichloroethane (80 mL) and this solution is heated for about 10 minutes with reflux until the initially blue solution has turned green and none of the starting product is detectable by thin film chromatography. The solution is allowed to cool and water (100 mL) is added. The organic phase is washed with water three times (50 ml on each occasion) and the solvent is drawn off in a vacuum. The residue is dissolved in chloroform for cleaning and filtered over silica gel Yield: 4.6 g (8.1 mMol, 88%), copper-coloured needles.

Decomposition point>320° C.

Execution Examples

A functional solar cell may be constructed using the described compounds having general formula types A, B and C. The photoactive semiconductor (component) in which the compounds described previously are implemented is characterized notably by high thermal stability and good photostability, which helps to ensure a particularly long service life for the component The photoactive layers may be used in solar cells with MiM, Mip, Min, pin or pii structures. (M=Metal, p or n=p- or n-doped organic or inorganic semiconductor, i=intrinsically conductive combination of organic layers; see for example J. Drechsel et al., Org. Electron., 5(4), 175 (2004) or Maennig et al., Appl. Phys. A79, 1-14 (2004)).

The photoactive layers may also be used in tandem solar cells (see Peumans et al. J. Appl. Phys. 93 (7), 3693-3723 (2003)) or in tandem/multiple solar cells consisting of two or more stacked MiM, Mip, Min, pin or pii diodes (see J. Dreschel et al. Thin Solid Films, 451452, 515-517 (2004)). A multiple solar cell includes at least two electrodes and a stack of any number of layers, but at least two, of which at least one layer comprises compounds of types A-C. Provision of a further layer, which may consist of organic and/or inorganic materials, and serves as a "conversion contact" for recombining electrons and holes may also be envisaged.

A photoactive component according to the invention may also contain conversion contacts of thin metal layers, inorganic materials (for example nanocrystals, which consist of clusters of metal or inorganic material smaller than 100 nm) or organic materials (for example doped or undoped molecules or polymers).

A photoactive semiconductor component according to the invention may also contain anti-diffusion layers of metals or transition metals such as titanium, palladium or chromium.

According to the invention, materials to assist with encapsulation, such as SiN or SiO2, may also be included in the component. Transparent cover layers made from organic materials, in particular N,N,N',N'-Tetrakis(4-methoxyphenyl)-benzidine or Tris-(8-hydroxyquinolinato)-aluminium, or inorganic materials such as TiO2 or SiO2, are conceivable.

The component according to the invention or parts thereof may also be manufactured in the reverse order ("inverted"), for example by swapping the hole transport layer and the electron transport layer, or swapping the top contact and the base contact.

The component may also include contacts of thin metal layers that are constructed from a metal or a combination of several metals. An advantageous embodiment of the invention includes elements selected from the group of aluminium, silver, gold, ytterbium, chromium, nickel, magnesium and iron in such electrical contacts.

It is also conceivable that the component may have contacts made from an organic material, which may be a conductive polymer or a combination of several organic materials. An advantageous embodiment of the invention contains polyethylene dioxythiophene):poly(styrene sulphonate) [PEDOT:PSS].

It may also be provided that the component according to the invention is prepared on a substrate, for example on glass, wood, aluminium foil, a metal surface such as steel, copper or similar, textile materials or plastic film.

A base contact of metal, a conductive polymer or a transparent conductive oxide or a combination thereof may preferably be present on a such a substrate.

The preparation of such a component according to the invention is known to one stalled in the related art The component (semiconductor) or at least parts thereof may be produced by thermal evaporation or other thermal Methods, by rotation coating/spincoating, dip-coating, drop-casting, doctor-blading, chemical vapour phase deposition (CVPD), or organic vapour phase deposition (OVPD), electrodeposition or other chemical, electrochemical or wet chemical processes, silkscreen printing, offset panting, inkjet printing or other painting-based processes, magnetron sputtering or other sputtering-based methods, molecular beam epitaxy or similar methods. roll-to-roll or similar methods, lamination on a film or similar methods, self-assembled monolayers" process or similar processes.

Figure 9A:
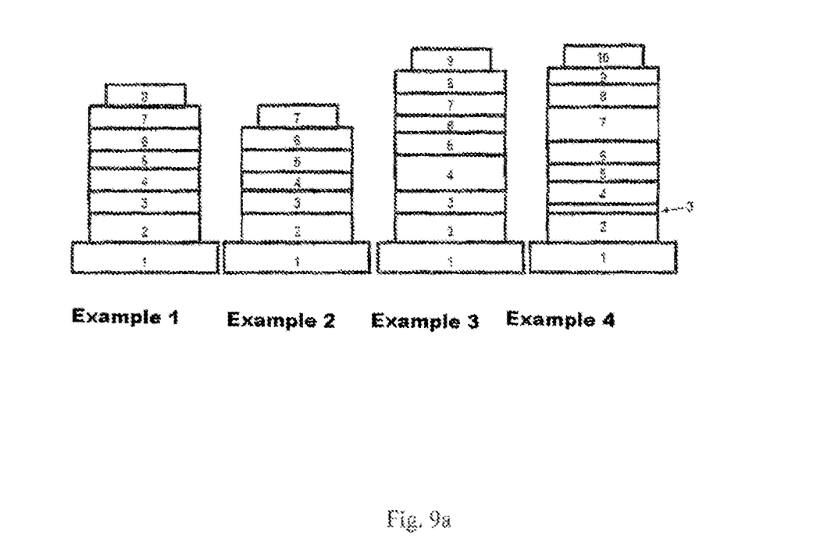
FIG. 9a shows layer constructs of different embodiments of the component according to the invention.

The following exemplary components were produced an the basis of the layer constructs shown in FIG. 9a.

Example 1

A sample on glass (1), with transparent cover contact ITO (2), a photoactive layer of buckminsterfullerene C60 (3), a photoactive layer of compounds of formula type A-C (4), a relatively thin undoped layer of PV-TPD (KM-di(4-(2,2-diphenylethene-1-yl)-phenyl)-N,N'-di(4-methylphenylphenyl)benzidine) (5), a doped layer of PV-TPD (6), a doped layer of ZnPc (7) and a gold cover contact (8). Layers (5) to (7) serve to provide a contact between the active layer and the cover layer.

Figure 10:
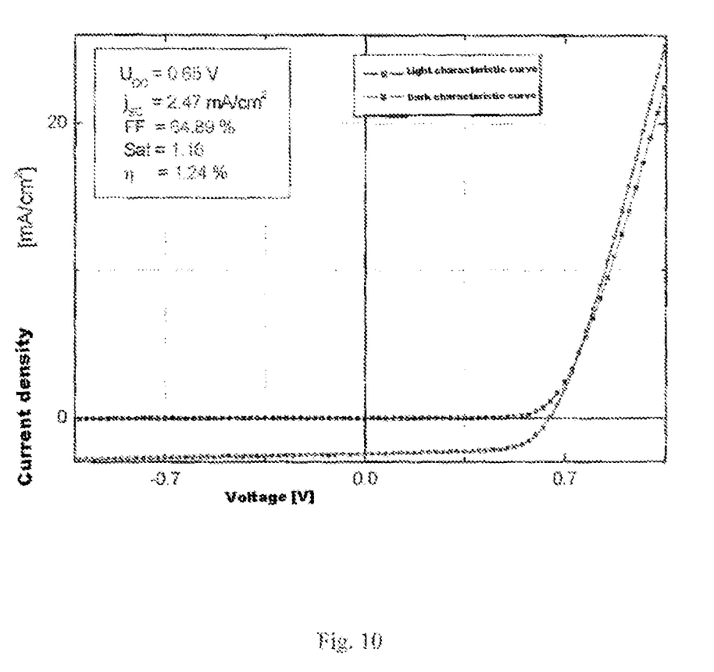
FIG. 10 shows a current-voltage characteristic of a solar cell described in Example 1 with compound B1 and C60 as the photoactive layer.
Figure 11:
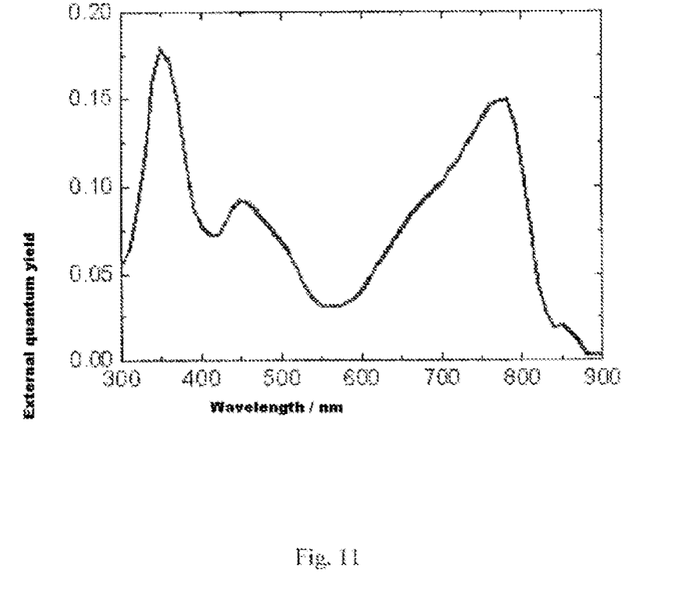
FIG. 11 shows a graph of the spectral external quantum yield of a solar cell with compound B1 and C60 as the photoactive layer.

The current-voltage characteristic of such a cell is shown in FIG. 10. The spectral external quantum yield, defined as the number of electrons discharged per incident photon, is represented in FIG. 11. This shows clearly that both C60 and compounds having formula types A-C are photoactive.

Common materials that may be used for the active layer in combination with compounds A-C include metal (zinc, copper, lead, aluminium chloride, titanium, cobalt, and others), phthalocyanines (Zac, CuPc, PbPc, ClAlPc, TiPc, CoPc), buckminsterfullerenes (for example C60 or C70), dicyanovinyl-oligothiophene derivatives (DCVxT), perylene derivatives (PTCDA, FTCDI), naphthalene derivatives (NTCDA, NTCDI), pentacene, rubrene, diindenoperylene and polymer materials such as [6,6]-phenyl-C61-butanoic acid methylester or poly(3-hexylthiophene) (PCBM or P3HT).

Example 2

A sample on glass (1), with transparent cover contact ITO (2), a photoactive mixed layer of C60 and compounds of formula type A-C (3), a relatively thin, undoped layer of PV-TPD (4), a doped layer of PV-TPD (5), a doped layer of ZnPc (6), and a gold cover contact (7). The mixed layer (4) enables an increase in the receivable current, since unlike the single layers its layer thickness is not limited by the diffusion length of the excitons, it is only limited by the condition that the electrons and holes generated must be able to exit the mixed layer via connected paths.

Example 3

Combination of Mixed and Single Layers

A sample on glass (1), with transparent cover contact ITO (2), a photoactive layer of buckminsterfullerene C60 (3), a photoactive mixed layer of C60 and compounds of formula type A-C (4), a photoactive layer of compounds of formula type A-C (5), a relatively thin, undoped layer of PV-TPD (6), a doped layer of PV-TPD (7), a doped layer of ZnPc (8), and a gold cover contact (9). In this case, the mixed and single layers are combined in order to maximise the possible current density.

Example 4

Pii Structure

A sample on glass (1), with transparent cover contact ITO (2), a relatively very thin layer of gold (3), a doped layer of PV-TPD (4), a relatively thin, undoped layer of PV-TPD (5), a photoactive layer of compounds of formula type A-C (6), a photoactive mixed layer of C60 and compounds of formula type A-C (7), a photoactive layer of buckminsterfullerene C60 (8), a relatively thin layer of exciton-blocking Bphen (9), and a cover contact of aluminium (10).

Such a structure thus enables the presence of active layers that absorb photons and are applied together in a mixed layer (Example 4, (6) in FIG. 9a).

It is also possible according to the invention that the (organic) photoactive structure element contains materials that act as an "exciton-blecking" layer, that is to say it is intended to prevent excitons from reaching the electrode, see Example 4, (8). Examples of such are bathocuproin (BCP), 4,7-Diphenyl-1,10-phenanthroline (Bphen).

Common hole transport materials (FIG. 9a, example 4, item 4) that are able to be combined with compounds of formula type A-C are 4,4',4"-tris(1-naphthylphenylamine)-triphenylamine (TNATA), N,N'-Di(napthalen-1-yl)-NR-diphenyl-benzidine (alpha-NPD), 4,4'-Bis-(N,N-diphenylamino)-quaterphenyl (4P-TPD), N,N'-Diphenyl-N,N'-bis (4'-(N,N-bis(naphth-1-yl)-amino)-biphenyl-4-yl)-benzidine (Di-NPB), N,N,N',N'-Tetrakis(4-methoxyphenyl)-benzidine (MeO-TPD). An advantageous variant contains materials in the hole transport layer that serve as dopants (acceptors). An example is 2,3,5,6-Tetrafluoro-7,7,8,8-tetracyanoquinodimethane (F4-TCNQ).

Examples of electron transport materials (ETL), that we capable of being combined with compounds of formula type A-C are 1,4,5,8-Naphthalene-tetracarboxylic acid-dianhydride (NTCDA) or buckminsterfullerene (C60). An advantageous variant contains material in the ETL that serve as dopants (donors). An example of such is (N,N,N',N'-tetramethylacridine-3,6-diamine) (AOB).

A functional (organic) field effect transistor may be constructed using the described compounds having general formula types A, B and C. In this contract, the architecture thereof may be designed either as a top-gate or a bottom-gate variant.

In addition, the organic semiconductor layer consisting of compounds A, B and C may be doped with suitable dopants to increase the concentration of charge carriers. Examples of such are (F4-TCNQ) as the acceptor and (AOB) as the donor.

Example 5

Figure 12:
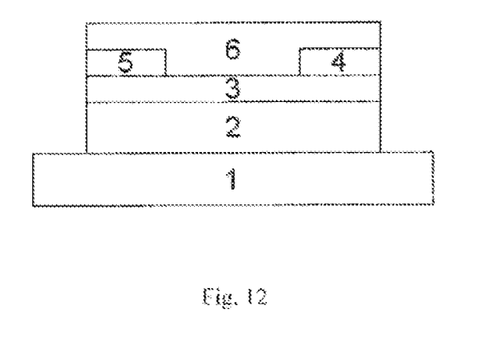
FIG. 12 shows a layer structure of the component illustrated in embodiment 5.

FIG. 12

A sample on glass (1), silicon (2) as the gate electrode, oxidised silicon (3) as the dielectric with two gold electrodes as the source (4) and drain (5) and of the semiconductor layer (6) made from compounds having formula type A-C.

Figure 9B:
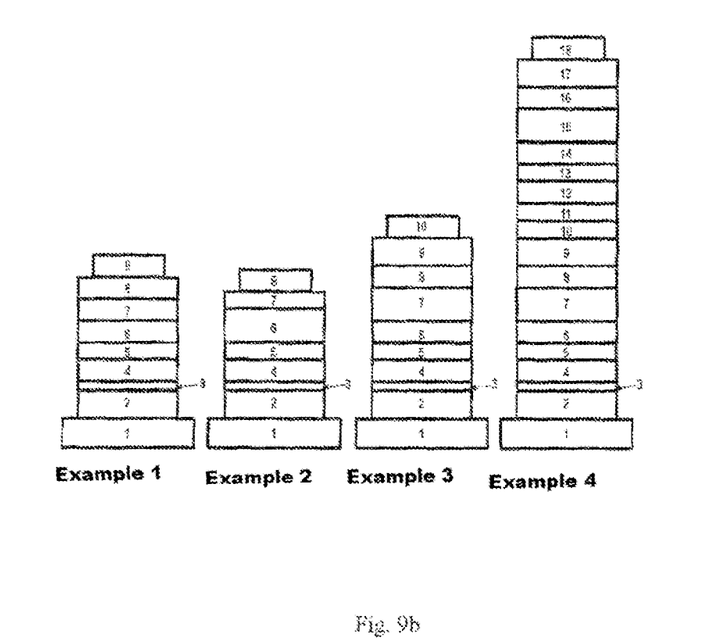
FIG. 9b shows layer constructs of different embodiments of the component according to the invention.

The following exemplary components were produced on the basis of the layer constructs shown in FIG. 9b.

Example 1

Pin-Structure—Single Layers

A sample on glass (1), with trans-parent cover contact ITO (2), a relatively very thin layer of gold (3), a doped layer of PV-TPD (4), a relatively thin undoped layer of PV-TPD (5), a photoactive layer of compounds of formula type A-C (6), a photoactive layer of buckminsterfullerene C60 (7), an n-doped layer of C60 (8) and a cover contact of aluminium (9).

Example 2

Pin-Structure—Mixed Layer

A sample on glass (1), with transparent cover contact ITO (2), a relatively very thin layer of gold (3), a doped layer of PV-TPD (4), a relatively thin undoped layer of PV-TPD (5), a photoactive mixed layer of C60 and compounds of formula type A-C (6), an n-doped layer of C60 (7), and a cover contact of aluminium (8).

Example 3

Pin-Structure—Combination of Mixed and Single Layer

A sample on glass (1), with transparent cover contact ITO (2), a relatively very thin layer of gold (3), a doped layer of PV-TPD (4), a relatively thin, undoped layer of PV-TPD (5), a photoactive layer of compounds of formula type A-C (6), a photoactive mixed layer of C60 and compounds of formula type A-C (7), a photoactive layer of buckminsterfullerene C60 (8), an n-doped layer of C60 (9), and a cover contact of aluminium (10).

Example 4

Tandem Cell

A sample on glass (1), with transparent cover contact ITO (2), a relatively very thin layer of gold (3), a doped layer of PV-TPD (4), a relatively thin, undoped layer of PV-TPD (5), a photoreactive layer of compounds of formula type A-C (6), a photoactive mixed layer of C60 and compounds of formula type A-C (7), a photoactive layer of buckminsterfullerene C60 (8), an n-doped layer of C60 (9), a relatively thin, relatively heavily n-doped layer of C60 (10), a relatively thin, relatively heavily p-doped layer of PV-TPD (11), a p-doped layer of PV-TPD (12), a relatively thin, undoped layer of PV-TPD (13), a photoactive layer of compounds of formula type A-C (14), a photoactive mixed layer of C60 and compounds of formula type A-C (15), a photoactive layer of buckminsterfullerene C60 (16), an n-doped layer of C60 (17), and a cover contact of aluminium (18).

Such a structure thus enables the presence of active layers that absorb photons and which are applied together in a mixed layer (Example 2, (5) in FIG. 9b).

The features disclosed in the present description, claims and drawing may be essential either individually or in any combination to the realisation of the invention in the broadest possible range of embodiments thereof.

The invention claimed is:

1. A semiconductor component comprising multiple layers, wherein at least one of the layers includes at least one compound having general formula A, B or C:

A

B

-continued

C wherein M is a metal ion; R is selected independently in each case from the group consisting of, unsubstituted or substituted, $C_1$-$C_{20}$ alkyl, $C_1$-$C_{20}$ heteroalkyl, $C_6$-$C_{20}$ aryl, $C_6$-$C_{20}$ heteroaryl, saturated or unsaturated carbocyclic, and saturated or unsaturated heterocyclic compounds; $L^1$ and $L^2$ may be the same or different, and represent atomic or molecular assemblies that completely fill the valence shell of M; and —Xi— represents a molecular fragment that together with the adjacent C—C double bond of the pyrrole ring forms an aromatic or heteroaromatic structure element.

2. The semiconductor component as recited in claim 1, wherein M stands for a metal ion that is selected from the ions of the elements in groups 9 to 13 of the Periodic Table.

3. The semiconductor component as recited in claim 1, wherein each Xi is selected independently from structures $X_1$ to $X_{11}$:

$X_1$

$X_2$

$X_3$

$X_4$

$X_5$

$X_6$ $X_7$ $X_8$ $X_9$ $X_{10}$ $X_{11}$ wherein $R^1$-$R^7$ are selected independently from the group consisting of hydrogen, halogen, $C_1$-$C_{20}$ alkyl, $C_1$-$C_{20}$ heteroalkyl, $C_6$-$C_{20}$ aryl, $C_6$-$C_{20}$ heteroaryl, saturated or unsaturated carbocyclic, and saturated or unsaturated heterocyclic compounds, wherein each $C_1$-$C_{20}$ alkyl, $C_1$-$C_{20}$ heteroalkyl, $C_6$-$C_{20}$ aryl, and $C_6$-$C_{20}$ heteroaryl is independently substituted or unsubstituted, and wherein the carbocyclic and heterocyclic rings comprise one member or two adjacent members of $R^1$-$R^7$; and wherein Q stands for a divalent atomic assembly that comprises at least one of the elements C, N, O or S.

4. The semiconductor component as recited in claim 1, wherein $L^1$ and $L^2$ are chosen independently from the group consisting of halogen, alkyl, aryl, alkyloxy, aryloxy, acyl, aroyl, alkenyl, and alkinyl; or wherein $L^1$ and $L^2$ are each bound to an R.

5. The semiconductor component as recited in claim 1, wherein at least one layer comprising the compound of formula A, B, or C is a is a light absorber layer or a charge carrier transport layer.

6. The semiconductor component as recited in claim 5, wherein the charge carrier transport is a doped or partially doped transport layer.

7. The semiconductor component as recited in claim 1, wherein the component is a photoactive component.

8. The semiconductor component as recited in claim 1, wherein the multiple layers are structured in a pin, nip, ni, ip, pnip, pni, pip, nipn, nin, ipn, pnipn, pnin, pipn structure, or any combination thereof.

9. The semiconductor component as recited in claim 1, wherein the component is an organic semiconductor component.

10. The semiconductor component as recited in claim 1, wherein the structure element is selected from an organic solar cell, a photodetector, or an organic field effect transistor.

11. The semiconductor component as recited in claim 1, wherein the metal ion has a charge of such magnitude that electroneutral complexes of type B or C are created.

12. The semiconductor component as recited in claim 2, wherein the metal ion is selected from Co, Ni, Cu, Zn, Hg, B, or Al.

* * * * *